United States Patent [19]

Weisman et al.

[11] Patent Number: 5,591,480

[45] Date of Patent: Jan. 7, 1997

[54] METHOD FOR FABRICATING METALLIZATION PATTERNS ON AN ELECTRONIC SUBSTRATE

[75] Inventors: Douglas H. Weisman, Sunrise; Thomas J. Swirbel, Davie; John K. Arledge, Ft. Lauderdale, all of Fla.

[73] Assignee: Motorola, Inc., Schaumburg, Ill.

[21] Appl. No.: 517,392

[22] Filed: Aug. 21, 1995

[51] Int. Cl.⁶ .............. B05D 5/12; C23C 14/00; C25D 5/02; H01L 21/465
[52] U.S. Cl. .............. 216/13; 427/124; 427/126.3; 427/259; 427/109; 204/192.32; 205/122; 205/221; 205/222; 205/223; 156/652.1; 216/23; 216/95; 216/102; 216/105; 359/88; 359/87; 437/228; 437/245; 437/246; 437/181
[58] Field of Search ............. 204/192.32; 205/122, 205/123, 220, 221, 222, 223; 427/510, 512, 100, 109, 124, 125, 126.3, 259; 216/13, 23, 41, 67, 72, 95, 102, 105; 156/652.1; 437/228 I, 228 W, 245, 246, 181; 359/88, 87

[56] References Cited

U.S. PATENT DOCUMENTS

| | | | |
|---|---|---|---|
| 4,358,748 | 11/1982 | Gruner et al. | 216/13 |
| 4,495,026 | 1/1985 | Herberg | 156/652.1 |
| 4,684,436 | 8/1987 | Burns et al. | 216/13 |
| 4,917,466 | 4/1990 | Nakamura et al. | 350/336 |
| 4,925,524 | 5/1990 | Beatty | 216/13 |

FOREIGN PATENT DOCUMENTS 62-238647  10/1987  Japan.

*Primary Examiner*—Kathryn Gorgos
*Assistant Examiner*—Edna Wong
*Attorney, Agent, or Firm*—Dale W. Dorinski

[57] ABSTRACT

One method for fabricating solderable pads (406) onto a substrate (220) for direct chip attachment uses a multilayer metallization coating (500). The coating has a bottom layer (202) of indium-tin oxide, with an intermediate layer (204) of copper and a top layer (206) of indium-tin oxide. A masking layer (208) is deposited on the active display area (402) of the substrate, leaving the bonding pads uncovered. The revealed bonding pads are then plasma etched, using the polyimide as an etch resist, and the top layer of ITO is selectively removed to reveal the underlying copper layer. The exposed copper layer (204) is then plated with a solderable metal to the desired thickness to form bonding pads that may be used with direct chip attachment schemes.

25 Claims, 4 Drawing Sheets

5,591,480

METHOD FOR FABRICATING METALLIZATION PATTERNS ON AN ELECTRONIC SUBSTRATE

TECHNICAL FIELD

This invention relates in general to thin film devices, and more particularly to methods of patterning thin film metallization on electronic substrates.

CROSS REFERENCE TO RELATED APPLICATIONS

This application is related to U.S. patent application Ser. No. 08/345,042 filed Nov. 25, 1994, by Roger A. Davenport, entitled "SAW Device having Acoustic Element with Diverse Mass Loading and Method for Forming Same," and assigned to Motorola, Inc.

BACKGROUND

The manufacture of thin film electronic devices (TFED) often requires that different metal systems be located in varying areas of the same substrate. While there have been a number of approaches to this problem, they all required numerous steps and precise control of the photolithography process that is often beyond the skill of the ordinary artisan. For example, some passive TFED, such as Surface Acoustic Wave (SAW) devices use metal systems that have multiple thicknesses on the same substrate to enhance performance. Precise control of the dimensions and location of the SAW metallization pattern is critical to insure optimum performance of the SAW. In other devices, such as a liquid crystal display (LCD) module, it is often desirable to mount the LCD integrated circuit (IC) driver directly to one of the glass substrates of the LCD. Wire bond or flip chip methods may be used to attach the IC die on to the glass substrate, with the flip chip technique being typically preferred because it requires less space. When wire bonds are used, additional area and volume is needed for both the wire bonds and either the lid enclosure or the polymeric glob top encapsulant material. Flip chip attachment requires that a suitable bond be formed between the integrated circuit (IC) pad metallization and the substrate metallization. For flip chip applications, the IC bond pads are either gold plated or tin-lead bumped using a well known controlled collapse chip connection (C4) process. Examples of direct chip bonding to the glass substrate is demonstrated in U.S. Pat. Nos. 4,643,526 and 4,917,466, incorporated herein by reference.

However, present IC bonding techniques such as thermocompression do not provide sufficient adhesion for providing reliable joints. It is usually necessary to selectively add subsequent metal layers such as nickel and/or gold over the indium-tin oxide (ITO) through additive vacuum deposition and following this by plating steps to achieve a bondable surface. This requires time consuming and repetitive photolithography operations to metallize the desired areas, at a significant additional expense. Alternatively, significant effort has been spent trying to attach IC's directly to the ITO metallization pattern using conductive epoxies and anisotropic conductive films. While these methods have merit, they do have limitations, especially as package densities increase and conductor lines are routed between bond pads, leaving geometries on the order of 0.0254 millimeter (0.001 inch) or less. A need thus exists in the art for a method for forming metallic areas on a substrate during fabrication which, if desired, may be overplated to provide high resolution bond sites for "chip on glass" applications. It would be advantageous if one could devise a method to achieve a highly controlled metal pattern on a substrate, while at the same time allowing one to have multiple metal thicknesses and compositions on various parts of the substrate, without the need for multiple photolithographic alignment steps. This would produce improved SAW devices, and the LCD driver IC could be directly bonded to the display.

DETAILED DESCRIPTION OF THE PREFERRED EMBODIMENT

A novel manufacturing process provides an improved method of forming metallization patterns on a substrate by employing a barrier layer of a metal that is resistant to an etching process. A first layer of a metal is deposited on the substrate. A second layer of a different metal is deposited directly on top of the first layer. This layer is also known as the barrier layer. A third layer of metal, the same composition as the first layer, is deposited on top of the second layer, to form a multilayer structure. The multilayer metal system is then patterned to a desired pattern, using photolithographic techniques. This results in a multilayer metallization pattern on the substrate with various portions of the substrate exposed, that is, not covered with any metal. A portion of the metallization pattern is then masked using a suitable material, leaving other portions of the pattern exposed. The exposed portions are then etched with a suitable etchant, that is, one that will effectively etch the top metal layer but does not etch the barrier layer. In this way, the etching process stops at the inner or second layer, thus creating a metallization pattern having various thicknesses and different metals exposed. If desired, the mask can be removed, and additional metal deposition steps can be performed to deposit additional metal layers on the exposed barrier metal. Some specific examples of how this novel method can be used to form thin film electronic devices will now be presented.

In one embodiment of the invention, a surface acoustic wave (SAW) device containing two metal thicknesses is made by vapor depositing metal on a piezoelectric substrate, which is then photo-defined to produce transducer and reflector elements composed of fine interdigitated fingers and finger gratings.

Figure 1:
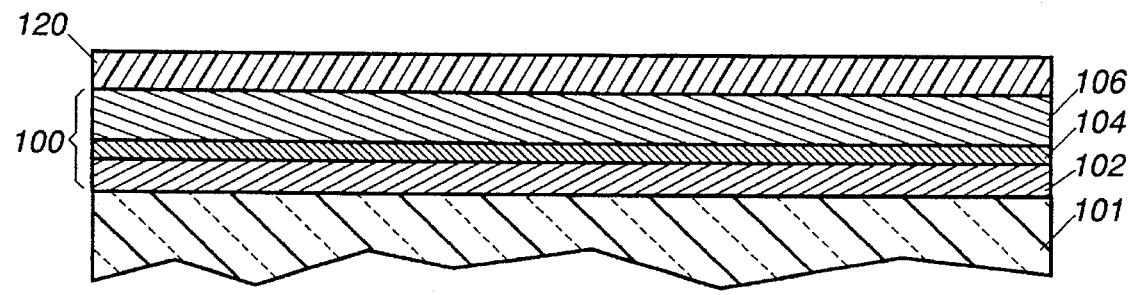
FIGS. 1–3 are cross-sectional views of a SAW in various stages of manufacture in accordance with the invention.

Step 1: Metal Deposition (FIG. 1) A piezoelectric substrate 101 is cleaned and placed in a vacuum system. It is then coated with sequential layers of aluminum 102, titanium 104, and aluminum 106 to form a multilayer metal system 100. The thickness of the first aluminum layer is typically 600–1000 Angstroms. The titanium thickness is typically about 200 Angstroms, and the top aluminum layer is typically 800–1200 Angstroms (Å). The titanium layer forms a barrier layer, to be used as an etch stop in later processing. In one embodiment, the aluminum and titanium films were vacuum deposited by electron beam evaporation at 25 Å/sec and 10 Å/sec, respectively. The vacuum chamber pressure was $2\times10^{-6}$ Torr.

Figure 2:
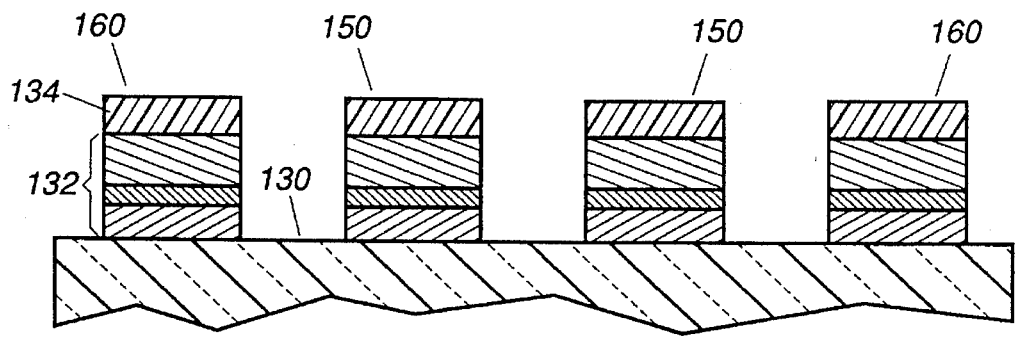

Step 2: Photodelineation The metallized substrate is spin coated with a liquid photoresist 120 to a thickness of about 1.0 micron. The substrate is then exposed to ultraviolet light @365 nm using a mask aligner with the device artwork pattern, including both transducer and reflector elements, such that the desired metallization is selectivity masked after the photoresist is developed. The resist was then developed (FIG. 2) to expose those portions of the metal system that are to be subsequently etched. All three metal layers (Al-Ti-Al) are etched in one step using a mixture of boron trichloride and chlorine in a reactive ion etcher. The etching conditions were:

pressure: 180 mTorr power: 300W $BCl_3$ flow: 25 cc/min $Cl_2$ flow: 5 cc/min (An optical endpoint detector was used to terminate the etching sequence.)

Etching times varied depending on the metal system thicknesses. The metal system described above was typically etched in approximately 60 seconds. At this point, the metallization pattern is now formed, with portions 130 of the substrate surface exposed. Those portions of the multilayer metal system 100 that were covered 132 with the patterned photoresist 134 have remained intact. The photoresist 134 is then stripped away using a solvent such as acetone to expose the metallization pattern. At this point, the SAW transducers 150 and reflectors 160 have been processed with the critical dimensions using a single mask.

Step 3: Masking The substrate is once again (FIG. 3) spin coated with a liquid photoresist 140 and exposed to ultraviolet light in a manner similar to that described in Step 2. However, this time, a photomask is used that will expose only the transducer regions, leaving the reflectors covered with photoresist and the transducers exposed. The photoresist is developed as in Step 2.

Figure 3:
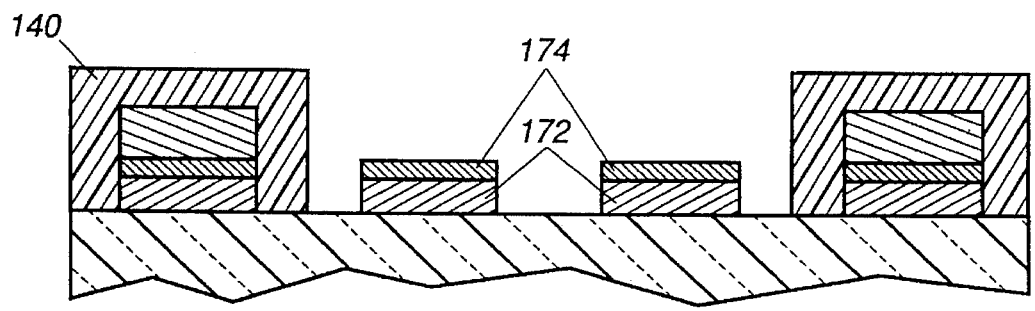

Step 4: Etching The substrate is then placed in an liquid etchant to remove only the upper aluminum layer (FIG. 3). When the top aluminum layer is gone, the etching is stopped by the thin titanium layer 174, because titanium is not affected by the etchant solution. The first aluminum layer 172 on the transducers remains intact because it is protected by the titanium layer 174. The following etch solution was used:

25 g–$K_3Fe(CN)_6$ 2.5 g–KOH 800 ml–$H_2O$

The titanium layer thus provides an etch stop for etching the entire substrate without problems associated with narrow process latitude or poor etching uniformity. After rinsing the substrate, the remaining photoresist is stripped, as in Step 5, to yield the final SAW structure. A dry etching method which has a high selectivity to etching the upper aluminum layer may also be used.

Figure 4:
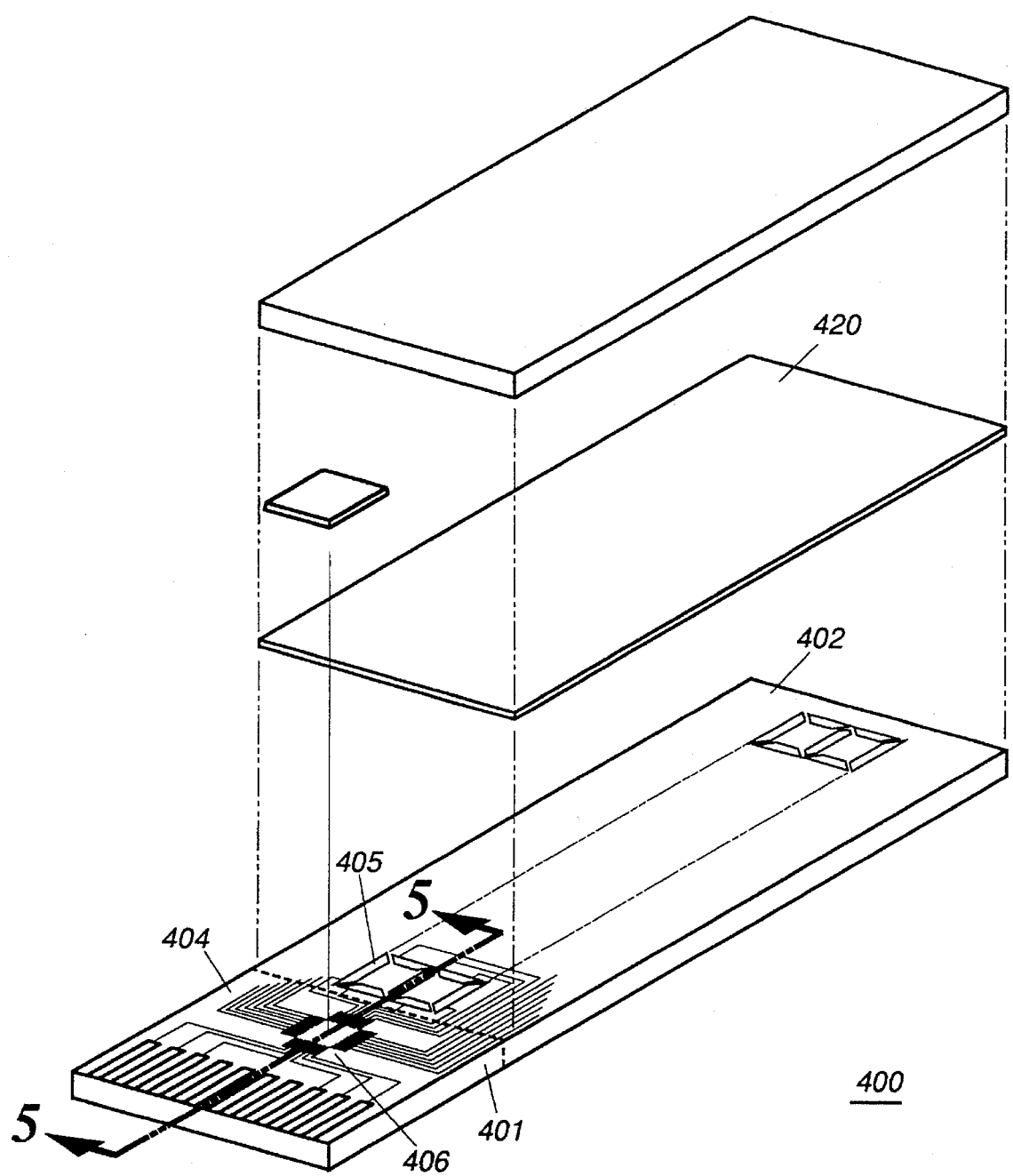
FIG. 4 is an exploded view of an LCD in accordance with the present invention.
Figure 5:
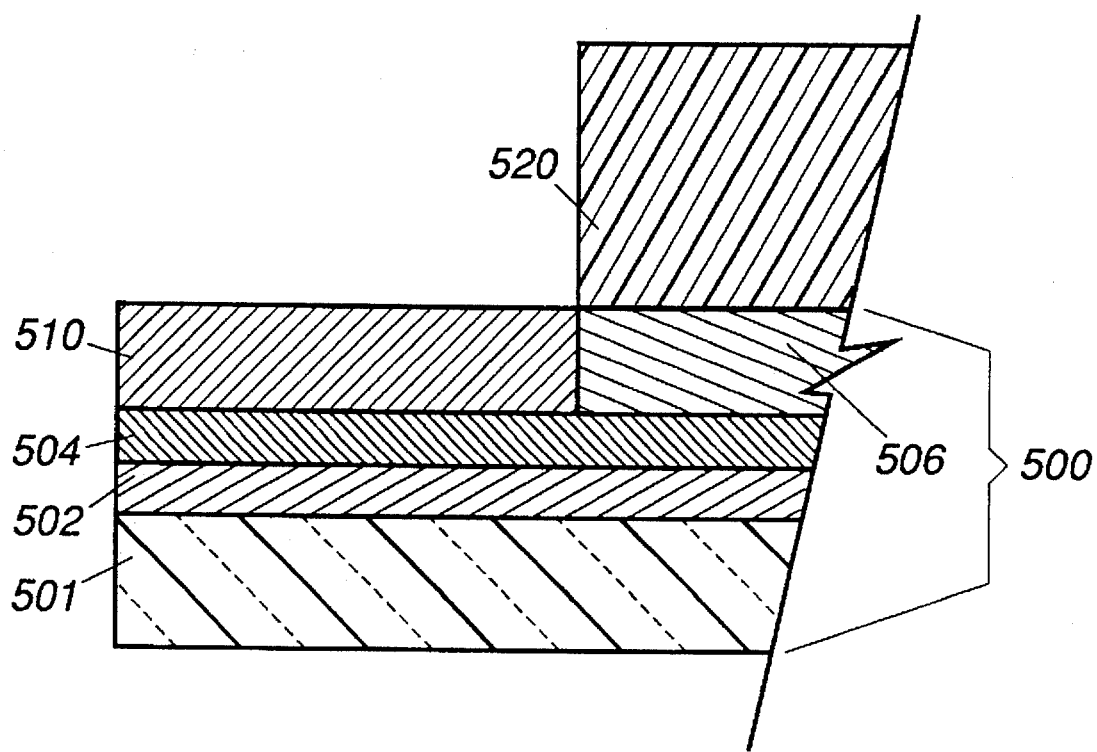
FIG. 5 is a cross-sectional view of the LCD of FIG. 4 through section '5—5' in accordance with the present invention.
Figure 6:
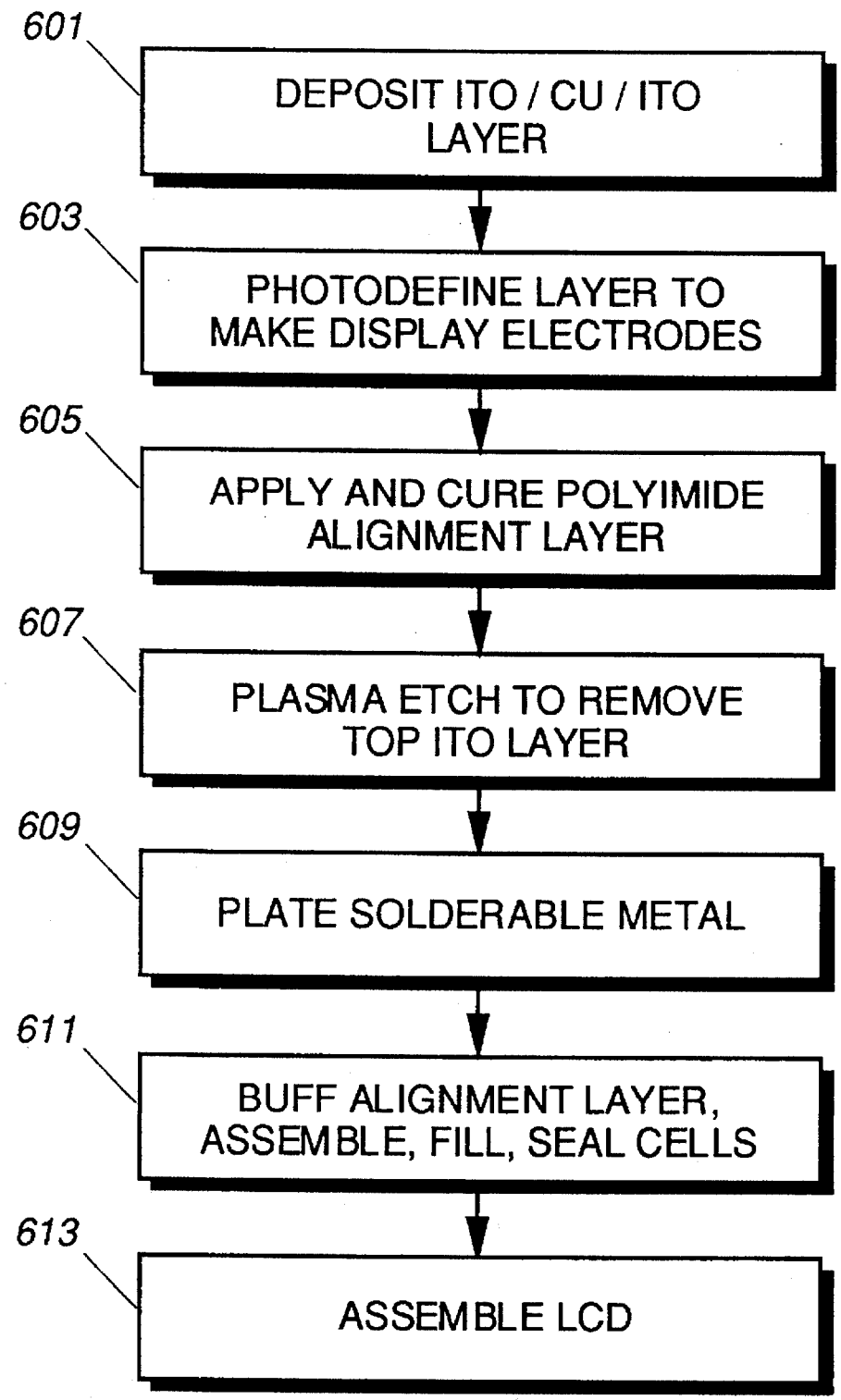
FIG. 6 is a flow chart showing a process for forming an LCD in accordance with the present invention.

In an alternate embodiment of the invention, the instant process can be used to form metallized surfaces of a liquid crystal display. Referring now to FIGS. 4–6, there is shown an exploded view and a cross-sectional view of a liquid crystal display module 400, along with a flow chart outlining the steps in the manufacturing process, in accordance with the present invention. Display module 400 includes a transparent substrate 401 having an active display area 402 and a display ledge 404 formed thereon. The substrate 401 includes bond or attachment pads 406, display electrodes 405 and circuitry metallization (runners) connecting the electrodes and the bond pads. In step 601 of the process, a display substrate with a multilayer coating 500 of ITO/copper/ITO deposited thereon is provided. Other metals may be substituted for the copper, for example, Ag, Au, Ni, Al, Cr, Ti or Sn. The multilayer metal coating is deposited in conventional manner, by, for example, sputtering or evaporation, with sputtering being the preferred method. The first layer 502 of ITO resides directly on an upper surface of the transparent substrate 501. The second layer 504, copper, in the preferred embodiment, lies directly on top of the first layer 502, and is covered by a third layer 506 of ITO. Those skilled in the art will understand that the ITO layers should be within certain thicknesses in order to be transparent and have the proper electrical conductivity. A preferred thickness range for the various layers is:

First indium-tin-oxide layer: between 100 and 1000 Angstroms

Second copper layer: between 50 and 100 Angstroms

Third indium-tin-oxide layer: between 100 and 10,000 Angstroms (Other thickness may, of course, be used, but these have been found to yield the best results.)

In step 603, the multilayer coating 500 is patterned into a circuitry pattern consisting of the display electrodes 405 and the attachment pads 401. The circuitry pattern is photodefined onto the glass substrate using well-known conventional photodefinition and etching techniques. One example of the photodefinition process as applied to LCD manufacturing may be found in U.S. Pat. No. 4,188,095, incorporated herein by reference. In this step, the three layers (502, 504, 506) of the multilayer coating 500 can be etched in the same step, or can be sequentially etched. Generally speaking, when chemical etching is used, all three layers are etched in essentially the same step, that is, they etch in order (top to bottom) but etch so fast that they are thought of as being etched at the same time. One may also envision alternate etching schemes where each layer is etched individually or in separate steps, and this is well within the metes and bounds of the invention.

Next (step 605) a polyimide alignment layer 420, 520 is applied to only the display portion 402 of the substrate 401. The polyimide alignment layer is typically between 500–1000 Å, and is appropriately dried and cured (for details on application and curing of specific polyimides, consult the polyimide manufacturer's directions). It is important that the polyimide be applied in a manner so as to cover the display electrodes 405, but to leave the attachment pads 406 on the ledge 404 free and uncovered. To rephrase, at this point, the polyimide only covers the display portion of the substrate, leaving all the attachment pads 406 revealed for a subsequent etching step.

At this point, the polyimide layer 420, 520 is typically cured by a heating step (not shown). The next step (607) is to sputter etch or dry etch to remove the uncovered portions of the third ITO layer 506. Plasma etching is a very controllable process, and since the ITO etches much faster than the underlying copper, the top layer can be precisely removed. This step results in the copper layer 504 being revealed in all areas where the multilayer metal coating 500 was not covered with polyimide. The polyimide 420, 520 acts as an etch resist, preventing the plasma from removing the covered ITO.

The attachment pads 406 now have an exposed metal layer 504 of a plateable metal that serves as an adherent layer for additional electroplating (step 609) using edge-type brush plating techniques, blectroplating techniques or electroless techniques. The plating step 609 produces a fourth layer of metal 2510 on the pads 406 that now provides a good surface for subsequent flip chip bonding of the IC. Some typical metals that can be used for plating are Au, Ag, Sn, Pb, In, Sb, Cr, and Ni. Techniques and suitable metal systems for plating to make a solderable surface are well documented in the literature.

The polyimide alignment layer 420, 520 is buffed in step 611 to align the polyimide surface molecules with the liquid crystal molecules. The buffing process is well known, and is used to produce the proper tilt angle in the liquid crystal fluid. The polyimide alignment layer is typically rubbed or buffed with short-nap polyester or cellulose acetate materials either in a static or rotating configuration. The latter may be a simple buffing machine with a paint roller attachment or a more sophisticated machine with controls for buffing wheel speed, roller pressure, and substrate travel. Buffing or rubbing of the film with materials that are higher melting than the film is believed to produce enough localized heating to cause the long-chain polymer molecules to become oriented with their chains parallel to the buffing (or rubbing) direction. The liquid crystal molecules that come into contact with such an oriented film are then aligned in the same direction as the polymer chains. A preferred tilt of the molecules occurs as a result of the interaction of the liquid crystal molecules with the chemical structure of the film. In further assembly steps, the substrate is sawn into individual display segments (if processed in array format), filled with liquid crystal fluid and end sealed in step 613. These process are well known to one skilled in the art, and more detail may be found in the incorporated references.

Traditionally, the two main difficulties in forming overlayers of this type are first, forming selectively metallized areas having sufficiently thick films without negatively impacting the transparent conductive ITO display conductor areas, and second, maintaining the metallic or partially oxidized state of the film through display processing, particularly during the high temperature (>200 degree Celsius) polyimide cure. The present invention overcomes these problems by protecting the plateable metal layer with a layer of ITO during the high temperature polyimide curing step. The top metal layer is then removed by selective etching.

Plasma etching is the preferred method in step 607 for removing the ITO from unwanted areas because the etch rate of the ITO is approximately 2.5 times that of the copper underlayer, and the polyimide protects the display's transparent conductive portions in the active display area. Pads defined using the present invention have been successfully fabricated down to 0.1016 millimeter (0.004 inch) pitch.

In summary, the present invention discloses a novel manufacturing process to form metallic pads which may be used for direct chip attach on LCD substrates or to make a SAW. The invention provides for;

1) a low cost display package without compromising the integrity of the display electrode metallization, and 2) a high reliability SAW with enhanced performance, with fewer processing steps.

What is claimed is:

1. A method for providing thin film metallization areas having varying thicknesses on an electronic substrate, comprising the steps of:

providing a substrate having a multilayer metal coating disposed on an upper surface thereof, the coating comprising a first aluminum layer on the substrate surface, a second titanium layer on top of the first layer, and a third aluminum layer on top of the second layer;

forming first and second metallization patterns in the multilayer metal coating by etching portions of the multilayer metal coating in a single step to reveal portions of the substrate upper surface;

applying a photoresist layer over the substrate sufficient to cover the first metallization pattern and to reveal the second metallization pattern;

chemically etching the revealed second metallization pattern to remove only the third aluminum layer, thereby exposing the underlying second titanium layer; and removing the photoresist layer after removing the third aluminum layer.

2. The method as described in claim 1, wherein the step of forming comprises defining the patterns by photolithography and chemical etching.

3. The method as described in claim 1, wherein the step of chemically etching is performed by plasma etching or wet etching.

4. The method as described in claim 1, wherein the step of providing comprises providing a first aluminum layer having a thickness of between 100 and 2000 Angstroms, providing a second titanium layer having a thickness of between 50 and 500 Angstroms, and providing a third aluminum layer having a thickness of between 100 and 10,000 Angstroms.

5. The method as described in claim 1, wherein the first metallization pattern is a reflector element of a surface acoustic wave (SAW), and the second metallization pattern is a transducer element of the SAW.

6. A method for providing solderable metallization areas on a liquid crystal display substrate, comprising the steps of:

providing a liquid crystal display substrate having a multilayer metal coating disposed on an upper surface thereof, the coating comprising a first layer of indium-tin-oxide on the substrate surface, a second metal layer on top of the first layer, and a third layer of indium-tin-oxide on top of the second metal layer;

forming a display electrode pattern and a bonding pad pattern in the multilayer metal coating by etching portions of the multilayer metal coating to reveal portions of the substrate upper surface;

applying a polyimide layer on the liquid crystal display substrate in a manner sufficient to cover the display electrode pattern and to reveal the bonding pad pattern;

selectively etching the revealed bonding pad pattern to remove only the third layer of indium-tin-oxide, thereby exposing the underlying second metal layer; and depositing a fourth layer, comprising a solderable metal, on the exposed second metal layer.

7. The method as described in claim 6, wherein the step of forming comprises defining the patterns by photolithography and chemical etching.

8. The method as described in claim 6, wherein the second metal layer comprises one or more materials selected from the group consisting of Cu, Ag, Au, Ni, Al, Cr, Ti and Sn.

9. The method as described in claim 6, wherein the step of providing comprises providing a first layer of indium-tin-oxide having a thickness of between 100 and 1000 Angstroms.

10. The method as described in claim 6, wherein the step of providing comprises providing a second metal layer having a thickness of between 50 and 100 Angstroms.

11. The method as described in claim 6, wherein the step of providing comprises providing a third layer of indium-tin-oxide having a thickness of between 100 and 10,000 Angstroms.

12. The method as described in claim 6, wherein the step of selectively etching the revealed bonding pad pattern is performed by plasma etching.

13. The method as described in claim 6, wherein the step of electively etching the revealed bonding pad pattern is performed by sputter etching.

14. The method as described in claim 6, wherein the step of forming comprises etching all three of the layers in a single step.

15. The method as described in claim 6, wherein the step of forming comprises etching each of the layers individually.

16. The method as described in claim 6, wherein the step of depositing a fourth layer is performed by electroless plating.

17. The method as described in claim 6, wherein the step of depositing a fourth layer is performed by electroplating.

18. A method for providing solderable metallization areas on a liquid crystal display substrate, comprising the steps of:

providing a liquid crystal display substrate having a multilayer metal coating disposed on an upper surface thereof, the coating comprising a first layer of indium-tin-oxide on the substrate surface, a second layer of copper on top of the first layer, and a third layer of indium-tin-oxide on top of the second copper layer;

forming a display electrode pattern and a bonding pad pattern in the multilayer metal coating by chemically etching portions of the multilayer metal coating in a single step to reveal portions of the substrate upper surface;

applying a polyimide layer on the liquid crystal display substrate in a manner sufficient to cover the display electrode pattern and to reveal the bonding pad pattern;

plasma etching the revealed bonding pad pattern to remove only the third layer of indium-tin-oxide, thereby exposing the underlying second layer of copper; and depositing a fourth layer, comprising a solderable metal, on the exposed second layer of copper.

19. The method as described in claim 18, wherein the step of forming comprises defining the patterns by photolithography.

20. The method as described in claim 18, wherein the step of providing comprises providing a first layer of indium-tin-oxide having a thickness of between 100 and 1000 Angstroms, providing a second layer of copper having a thickness of between 50 and 100 Angstroms, and providing a third layer of indium-tin-oxide having a thickness of between 100 and 10,000 Angstroms.

21. The method as described in claim 18, wherein the step of depositing a fourth layer is performed by brush plating, electroplating and electroless plating.

22. The method as described in claim 18, wherein the step of depositing a fourth layer is performed by electroplating.

23. A method for providing solderable metallization areas on a liquid crystal display substrate, comprising the steps of:

providing a liquid crystal display substrate having a multilayer metal coating disposed on an upper surface thereof, the coating comprising a first layer of indium-tin-oxide on the substrate surface, a second layer of copper on top of the first layer, and a third layer of indium-tin-oxide on top of the second copper layer;

forming a display electrode pattern and a bonding pad pattern in the multilayer metal coating by chemically etching portions of the multilayer metal coating in a single step to reveal portions of the substrate upper surface;

applying a polyimide layer on the liquid crystal display substrate in a manner sufficient to cover the display electrode pattern and to reveal the bonding pad pattern;

curing the polyimide layer;

plasma etching the revealed bonding pad pattern to remove only the third layer of indium-tin-oxide, thereby exposing the underlying second layer of copper; and depositing a fourth layer, comprising a solderable metal, on the exposed second layer of copper.

24. The method as described in claim 23, further comprising a step of buffing the polyimide layer to provide a preferential orientation on a surface of the polyimide layer.

25. A method for providing a thin film surface acoustic wave (SAW) filter having varying thicknesses on an electronic substrate, comprising the steps of:

providing a substrate having a multilayer metal coating disposed on an upper surface thereof, the coating comprising a first aluminum layer having a thickness of between 100 and 2000 Angstroms on the substrate surface, a titanium layer having a thickness of between 50 and 500 Angstroms on top of the first aluminum layer, and a second aluminum layer having a thickness of between 100 and 10,000 Angstroms on top of the titanium layer;

forming a reflector element of the SAW and a transducer element of the SAW in the multilayer metal coating by etching through all layers of the multilayer metal coating in a single step to reveal portions of the substrate upper surface;

applying a photoresist layer to mask the reflector element and reveal the transducer element;

etching the revealed transducer element to remove only the second aluminum layer, exposing the underlying titanium layer; and removing the photoresist layer.

* * * * *